United States Patent
Bae

(10) Patent No.: US 7,446,470 B2
(45) Date of Patent: Nov. 4, 2008

(54) ORGANIC ELECTROLUMINESCENT DEVICE AND METHOD FOR MANUFACTURING THE SAME

(75) Inventor: Hyo Dae Bae, Daegu (KR)

(73) Assignee: LG Electronics Inc., Seoul (KR)

( * ) Notice: Subject to any disclaimer, the term of this patent is extended or adjusted under 35 U.S.C. 154(b) by 209 days.

(21) Appl. No.: 11/290,569

(22) Filed: Dec. 1, 2005

(65) Prior Publication Data

US 2006/0119257 A1    Jun. 8, 2006

(30) Foreign Application Priority Data

Dec. 3, 2004    (KR)    ........................ 10-2004-0100925

(51) Int. Cl.
*H01L 51/50*    (2006.01)
*H01L 51/52*    (2006.01)

(52) U.S. Cl. ..................... 313/504; 313/505; 313/503; 313/500; 315/169.3

(58) Field of Classification Search ......... 313/498–512; 315/169.1, 169.3; 428/690–691, 917; 257/40, 257/72, 98–100, 642–643, 759; 427/66, 427/532–535, 539; 438/26–29, 34, 82

See application file for complete search history.

(56) References Cited

U.S. PATENT DOCUMENTS

| | | | | |
|---|---|---|---|---|
| 6,616,496 B1 * | 9/2003 | Lu | ................. | 445/24 |
| 6,624,567 B2 * | 9/2003 | Nagayama et al. | ........... | 313/503 |
| 6,832,941 B2 * | 12/2004 | Lu | ................. | 445/24 |
| 6,967,436 B2 * | 11/2005 | Park | ............................ | 313/504 |
| 2004/0140760 A1 * | 7/2004 | Chang et al. | ................. | 313/504 |
| 2005/0040754 A1 * | 2/2005 | Sakurai | ........................ | 313/500 |
| 2005/0067946 A1 * | 3/2005 | Park | ............................ | 313/503 |
| 2005/0082966 A1 * | 4/2005 | Yamazaki et al. | ............ | 313/498 |
| 2005/0099114 A1 * | 5/2005 | Wu et al. | ...................... | 313/504 |
| 2005/0179368 A1 * | 8/2005 | Ryu et al. | ...................... | 313/504 |
| 2006/0017375 A1 * | 1/2006 | Noguchi et al. | .............. | 313/504 |
| 2006/0197441 A1 * | 9/2006 | Tsai et al. | .................... | 313/506 |
| 2007/0052349 A1 * | 3/2007 | Giraldo et al. | .............. | 313/506 |
| 2007/0159068 A1 * | 7/2007 | Miyake | ....................... | 313/504 |

FOREIGN PATENT DOCUMENTS

WO    WO 2004102669 A1 *    11/2004

* cited by examiner

*Primary Examiner*—Mariceli Santiago
*Assistant Examiner*—Jose M Diaz
(74) *Attorney, Agent, or Firm*—Birch, Stewart, Kolasch & Birch, LLP

(57) ABSTRACT

An organic electroluminescent device includes a plurality walls intersecting with anode electrode layers and a plurality of mask supporting members formed between the anode electrode layers. A method for manufacturing the organic electroluminescent device includes: forming a plurality of anode electrode layers on a substrate; forming an insulating layer on the area except for predetermined areas of the anode electrode layers; forming a plurality of walls intersecting with each of the anode electrode layers; forming a plurality of mask supporting members, each formed on a predetermined area between the anode electrode layers; and forming organic EL layers and a plurality of cathode electrode layers by using a mask. The plurality of mask supporting members assists in preventing the walls and organic material layers from being damaged by the mask during the process of forming the organic EL layers and cathode electrode layers.

13 Claims, 3 Drawing Sheets

ORGANIC ELECTROLUMINESCENT DEVICE AND METHOD FOR MANUFACTURING THE SAME

BACKGROUND OF THE INVENTION

1. Field of the Invention

The present invention relates to an organic electroluminescent device of the active matrix (AM) and passive matrix (PM) types, and a method for manufacturing the same. Particularly, the present invention relates to an organic electroluminescent device and a manufacturing method therefore, having a structure that can prevent damage of walls and organic material layers caused by deformation of a metal mask used during a manufacturing process to deposit organic material layers.

2. Description of the Related Art

Organic electroluminescence is a phenomenon wherein excitons are formed in an organic (low molecular or high molecular) material thin film by re-combining holes injected through an anode with electrons injected through a cathode, and a light of specific wavelength is generated by energy from thus formed excitons. The basic structure of an organic electroluminescent device using the phenomenon and a method for manufacturing the same will be described hereinafter.

FIG. 1 is a plane view of an organic electroluminescent device, in accordance with the present invention, and FIG. 2 is a cross-sectional view of the organic electroluminescent device of FIG. 1, as taken along line A-A. Certain portions of the organic electroluminescent device of FIG. 1 are basic structures, in accordance with the related art. Those basic structures will now be described in the following paragraphs.

The basic structure of an organic electroluminescent device includes a glass substrate 1, an anode electrode layer 2 formed on the upper side of the glass substrate 1, an organic material layer 3 (hereinafter, referred to as "organic EL layer") formed on the anode electrode layer 2, and a cathode electrode layer 4 formed on the organic EL layer 3.

The organic EL layer 3 has a structure wherein a hole transport layer, a light emitting layer and an electron transport layer are stacked in order. Each cathode electrode layer 4 maintains a certain space from adjacent cathode electrode layers 4. The anode electrode layer 2 acts as an anode electrode, and the cathode electrode layer 4 acts as a cathode electrode.

A wall 5 separates two adjacent cathode electrode layers 4. The wall 5 is formed in an area between two adjacent cathode electrode layers 4. The wall 5 is separated from the anode electrode layer 2 by an insulating layer 4a. Although organic material and cathode electrode material are deposited on the upper side or top of each wall 5 during the processes of forming the organic EL layer 3 and cathode electrode layer 4, neither functions as a component of the device.

The organic electroluminescent device having the above structure is manufactured by the following processes.

First, a plurality of anode electrode layers 2 are deposited on a glass substrate 1, and then an insulating layer 4a is formed on the entire surface area of the substrate 1 except predetermined areas (luminescent areas).

Then, a plurality of walls 5 crossing the anode electrode layers 2 are formed thereon, followed by forming organic EL layers 3 and cathode electrode layers 4 on the entire structure including the walls 5.

For the organic EL layers 3, different organic materials, corresponding to R (red), G (green) or B (blue), are deposited in each luminescent area. FIG. 2 shows that one organic EL layer 3 and one cathode electrode layer 4 are formed between two walls 5, but the same structure of one organic EL layer and metal layer is formed at both sides to form R, G and B luminescent areas.

A metal mask is used to form an organic EL layer corresponding to each pixel area, and the relation between the mask and walls 5 will be described with reference to FIG. 5 below.

FIG. 3 is a cross-sectional view of the organic electroluminescent device of FIG. 1 as taken along line B-B, which illustrates the state just before forming the organic EL layers 3 and after forming the walls 5.

As described above, a mask M is used to form the organic EL layers 3, and the mask M is positioned on the walls 5. A magnetic field or force of a magnet (not shown), installed under the substrate 1, acts on the mask M. Therefore, the process of forming the organic EL layers can stably proceed without any movement of the mask M.

During the deposition process of organic EL layers, the mask M is attracted toward the substrate 1 by the magnet's force acting on the mask M, and thus the mask M is brought into contact with the walls 5, as shown in FIG. 3B, especially at the edge portion of the walls 5. This physical contact between the mask M and the walls 5 causes the walls 5 to be damaged (especially at the edges of the walls 5), thereby generating particles of the walls 5.

For example, after an organic EL layer corresponding to R luminescent area is formed, another organic EL layer corresponding to an adjacent G luminescent area or B luminescent area is formed. During the process of forming an organic EL layer corresponding to the G luminescent area or the B luminescent area, the mask M may sag toward the substrate 1 due to the magnet's attraction force, as shown in FIG. 3B.

Therefore, the mask M is brought into physical contact with the organic EL layer 3 in the R luminescent area, thereby damaging the organic EL layer, in addition to generating organic particles from the walls 5.

If the organic particles from damaged walls 5 exist on the organic EL layer 3, the particles may cause leakage current in the device, leading to defects of the display.

SUMMARY OF THE INVENTION

An object of the present invention is to solve one or more of the above mentioned problems occurring in the process of forming organic EL layers, and to provide an organic electroluminescent device and a manufacturing method thereof, which can prevent the walls and organic EL layers from being damaged during the process of forming organic EL layers.

The organic electroluminescent device according to the present invention comprises a plurality of pixels formed in luminescent areas that are the overlapping, intersecting areas of anode electrode layers and cathode electrode layers, and mask supporting members formed between the anode electrode layers.

The method for manufacturing the organic electroluminescent device according to the present invention comprises: forming a plurality of anode electrode layers on a substrate; forming an insulating layer on the area except a predetermined area of the anode electrode layers; forming a plurality of walls intersecting with the anode electrode layers; forming a plurality of mask supporting members, each formed on a predetermined area between the anode electrode layers; and forming organic EL layers and a plurality of cathode electrode layers by using a mask.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will be more clearly understood from the detailed description in conjunction with the following drawings.

DETAILED DESCRIPTON OF THE INVENTION

Hereinafter, the embodiments of the present invention will be described in detail with reference to those accompanying drawings.

The organic electroluminescent device according to the present invention has a feature that it has a structure that can minimize deformation of a mask used for forming organic EL layers. Thus, the overall structure of the device is the same as that of the device illustrated in FIGS. 1 and 2.

Figure 4:
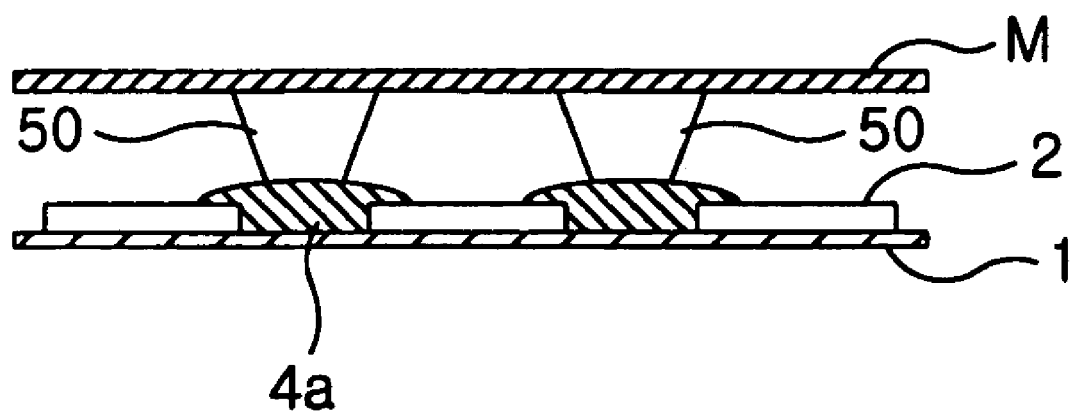
FIG. 4 is a cross-sectional view of the organic electroluminescent device of the present invention, which corresponds to a cross-sectional view of the organic electroluminescent device of FIG. 1 as taken along line C-C.

Therefore, the organic electroluminescent device according to the present invention will be described with reference to FIGS. 1 and 4. FIG. 4 is a cross-sectional view of the organic electroluminescent device of the present invention, which corresponds to a cross-sectional view of the organic electroluminescent device of FIG. 1 as taken along line C-C. In this figure, organic EL layers and cathode electrode layers are not illustrated, and only 3 anode electrode layers 2 are illustrated. For convenience, in FIG. 4, the same structural components as those in FIG. 1 are designated by the same reference numerals.

Figure 1:
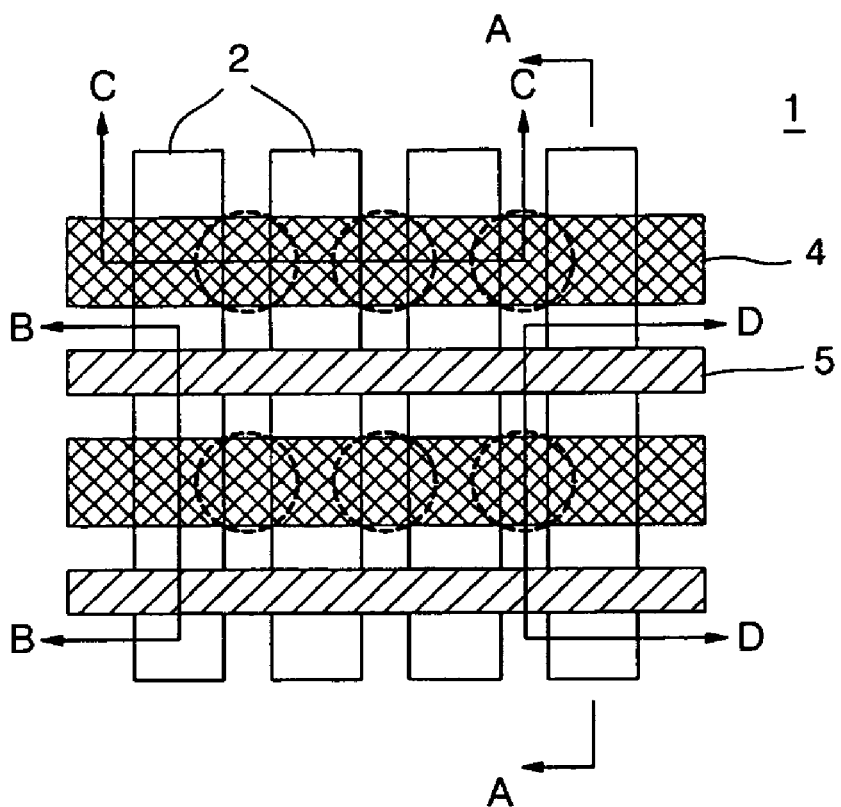
FIG. 1 is a plane view of an organic electroluminescent device.
Figure 2:
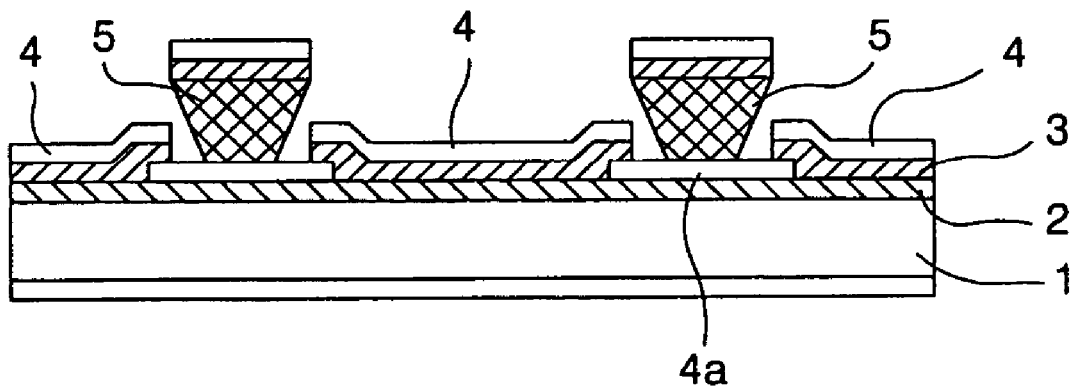
FIG. 2 is a cross-sectional view of the organic electroluminescent device of FIG. 1 as taken along line A-A.

A feature of the organic electroluminescent device according to one embodiment of the present invention is to form sub-walls 50 with a predetermined height as mask supporting members in the areas between adjacent anode electrode layers 2, as indicated with a dotted line in FIG. 1. The sub-walls 50 extend generally in a same direction of the anode electrode layers 2. The anode electrode layers 2 extending in a direction which is crossing, and more particularly substantially perpendicular to, to a direction of extension of cathode electrode layers 4. Walls 5 extend in generally a same direction of extension of the cathode electrode layers 4 and cross the anode electrode layers 2. In a preferred embodiment, the sub-walls 50 do not cross the walls 5. Hence, the sub-walls 50 are segmented walls with an extension direction (taken as a whole) which is generally perpendicular to the extension direction of the walls 5. The manufacturing steps of the organic electroluminescent device according to the one embodiment of the present invention will be described with reference to FIGS. 1 and 4.

First, a plurality of anode electrode layers 2 are formed on a glass substrate 1, and then an insulating layer 4a is formed on the substrate 1 except in predetermined areas (that is, luminescent areas).

Figure 5:
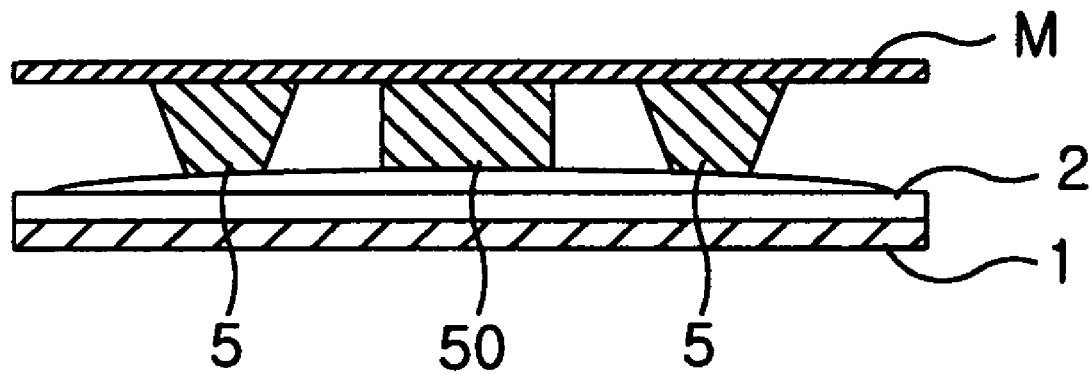
FIG. 5 is a cross-sectional view of the organic electroluminescent device of the present invention, which corresponds to a cross-sectional view of the organic electroluminescent device of FIG. 1 as taken along line D-D.

A plurality of walls 5 crossing the anode electrode layers are formed, followed by forming a sub-wall 50 in each area (or alternating, e.g. every other area) between adjacent two anode electrodes layers 2. Here, each sub-wall 50 is spaced from walls 5, as shown in FIGS. 1 or 5, and the sub-walls 50 may be referred to as a plurality of first walls 50 and the walls 5 may be referred to as a plurality of second walls 5. Preferably, sub-walls 50 are formed together with walls 5 in a single process, using a same material, by using a mask in which mask patterns for forming sub-walls 50 as well as walls 5 are formed.

The organic EL layers (R, G and B) and cathode electrode layers are formed on the upper side of the structure including the walls 5 and the sub-walls 50.

When organic EL layers are formed by using a mask M after forming sub-walls 50 formed on the insulating layer 4a, the mask M is prevented from deforming or sagging toward the substrate 1 by the walls 5 crossing the anode electrode layers 2 (as shown in FIG. 1) and the sub-walls 50 formed in the areas between the anode electrode layers 2 as shown in FIGS. 4 and 5, even though the force of a magnet installed under the substrate 1 acts on the mask M.

Figure 3A:
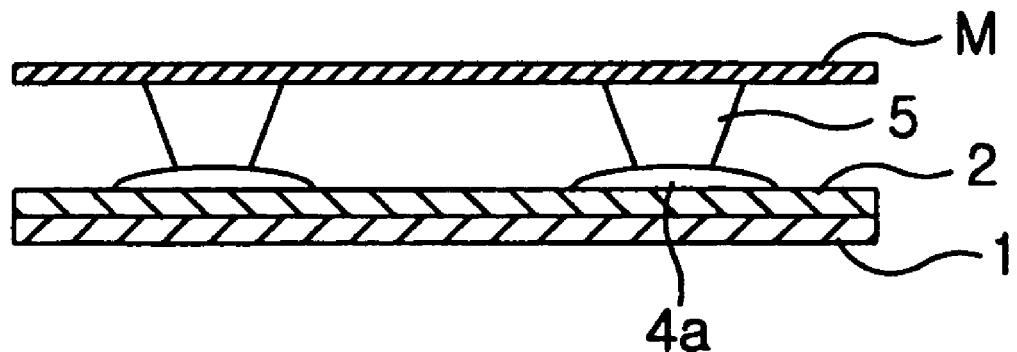
FIGS. 3A and 3B are cross-sectional views of the organic electroluminescent device of FIG. 1 as taken along line B-B, illustrating a an initial placement of a mask M and a sagging of the mask M under magnetic attraction, respectively.
Figure 3B:
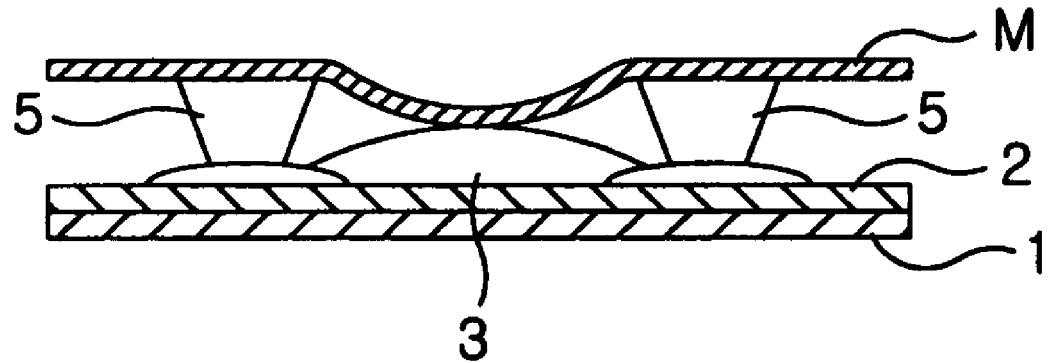

As a plurality of sub-walls 50 are located between the walls 5 crossing the anode electrode layers 2, deformation or sagging of the mask M can be minimized as shown in FIG. 3B, even though the distance between adjacent two walls 5 is large.

FIG. 5 is a cross-sectional view of the organic electroluminescent device of the present invention, which corresponds to a cross-sectional view of the organic electroluminescent device of FIG. 1 as taken along line D-D.

In this figure, organic EL layers and cathode electrode layers are not illustrated, and the same components are designated by the same reference numerals.

FIG. 5 illustrates the relation of sub-walls 50 formed between anode electrode layers 2 and walls 5, crossing anode electrode layers 2. As sub-walls 50 are positioned on each area between two adjacent walls 5, as shown in FIG. 5, deformation or sagging of a mask M toward the substrate 1 due to the magnetic force of a magnet can be minimized. The sub-walls 50 may have a generally rectangular cross sectional shape, or a trapezoidal cross sectional shape, as illustrated in FIG. 5.

The organic electroluminescent device of the present invention has a structure that can prevent deformation of the mask during forming organic EL layers caused by the force of a magnet. Thus, the present invention is effective for preventing damage of the walls, thereby inhibiting generation of organic particles. Also, the present invention is effective for preventing the mask from sagging so much as to contact the organic EL layers during the manufacturing process.

The preferred embodiments of the present invention have been described for illustrative purposes, and those skilled in the art will appreciate that various modifications, additions, and substitutions are possible, without departing from the scope and spirit of the present invention as disclosed in the accompanying claims.

What is claimed is:

1. An organic electroluminescent device comprising:
   a plurality of anode electrode lines formed on a substrate, wherein each anode electrode line is generally extended in a first direction and is spaced apart from each other;
   a plurality of cathode electrode lines disposed on the anode line, wherein each cathode electrode line is generally extended in a second direction crossing the first direction and is spaced apart from each other;
   a plurality of luminescent areas that are defined as overlying areas of the anode electrode lines and the cathode electrode lines;
   a plurality of island walls formed between adjacent anode electrode lines; and
   a plurality of line walls, each line wall being formed between the adjacent cathode electrode lines, wherein each line wall of said plurality of line walls extends across a plurality of said anode electrode lines, and wherein said island walls are located between said line walls.

2. The organic electroluminescent device of claim 1, wherein said island and line walls are formed of a same material.

3. The organic electroluminescent device of claim 1, wherein said island and line walls extend to a same height to support a mask during a manufacturing process of said organic electroluminescent device.

4. The organic electroluminescent device of claim 1, wherein an island wall of said plurality of island walls is formed between all adjacent pairs of anode electrode lines along one cathode electrode line of said cathode electrode lines.

5. The organic electroluminescent device of claim 1, wherein an island wall of said plurality of island walls is formed between alternating adjacent pairs of anode electrode lines along one cathode electrode line of said cathode electrode lines.

6. The organic electroluminescent device of claim 1, wherein said organic electroluminescent device is an active matrix (AM) device.

7. An organic electroluminescent device comprising:
   a plurality of anode electrode lines formed on a substrate, wherein each anode electrode line is extended in a first direction and is spaced apart from each other;
   a plurality of cathode electrode lines disposed on the anode line, wherein each cathode electrode line is extended in a second direction crossing the first direction and is spaced apart from each other;
   a plurality of luminescent areas that are defined as overlying areas of the anode electrode lines and the cathode electrode lines;
   a plurality of island walls formed between adjacent anode electrode lines; and
   a plurality of line walls, each line wall being formed between adjacent cathode electrode lines and is spaced apart from the island walls.

8. The organic electroluminescent device of claim 7, wherein each line wall of said plurality of line walls extends in said second direction.

9. The organic electroluminescent device of claim 7, wherein each line wall of said plurality of line walls extends across a plurality of said anode electrode lines, and wherein said island walls are located between said line walls.

10. The organic electroluminescent device of claim 7, wherein said island and line walls are formed of a same material.

11. The organic electroluminescent device of claim 7, wherein said island and line walls exist on a same layer of said organic electroluminescent device.

12. The organic electroluminescent device of claim 7, wherein said island and line walls extend to a same height.

13. The organic electroluminescent device of claim 7, wherein said organic electroluminescent device is a passive matrix (PM) device.

* * * * *